United States Patent [19]

Sakamoto et al.

[11] Patent Number: 4,700,440
[45] Date of Patent: Oct. 20, 1987

[54] LC FILTER MANUFACTURING METHOD

[75] Inventors: Yukio Sakamoto, Fukui; Shinichi Madokoro, Nyuu; Shingo Okuyama, Takefu, all of Japan

[73] Assignee: Murata Manufacturing Co., Ltd., Nagaokakyo, Japan

[21] Appl. No.: 836,517

[22] Filed: Mar. 5, 1986

[30] Foreign Application Priority Data

Mar. 29, 1985 [JP] Japan .................................. 60-67277

[51] Int. Cl.⁴ .............................................. H01G 4/28
[52] U.S. Cl. .................. 29/25.42; 29/602 R; 29/854
[58] Field of Search .................. 29/25.42, 602 R, 854; 336/105; 361/307

[56] References Cited

U.S. PATENT DOCUMENTS 4,593,341 6/1986 Herczog .............................. 29/25.42

Primary Examiner—Carl E. Hall
Attorney, Agent, or Firm—Wenderoth, Lind & Ponack

[57] ABSTRACT

A manufacturing method for a LC filter (an inductive filter) suitable for use as a noise filter, constituted by the steps of: inserting a central conductor into a cylindrical magnetic substance having electrodes on at least the end faces; dipping the central conductor and magnetic substance into molten solder to solder the electrodes to the central conductor; thereafter inserting the magnetic substance and central conductor into a cylindrical capacitor of a cylindrical dielectric which is provided on the inside and the outside with electrodes and on the outer peripheral surface a cylindrical eyelet member fitted thereon; sealing openings at both ends of the cylindrical capacitor by use of sealing members fitted onto the central conductor after the magnetic substance through which the central conductor passes is inserted into the cylindrical capacitor; then dipping the cylindrical capacitor into molten solder to solder the external electrode and the eyelet member; and remelting the solder for connecting the electrodes on the magnetic substance with the central conductor by the heat applied thereto when the capacitor is dipped into the molten solder, thereby connecting the electrodes on the magnetic substance with the internal electrodes on the cylindrical capacitor to complete the LC filter.

7 Claims, 8 Drawing Figures

LC FILTER MANUFACTURING METHOD

The present invention relates to a manufacturing method for an LC filter (an inductive filter), and more particularly to an manufacturing method for a LC filter suitable for use as a noise filter.

Figure 6:
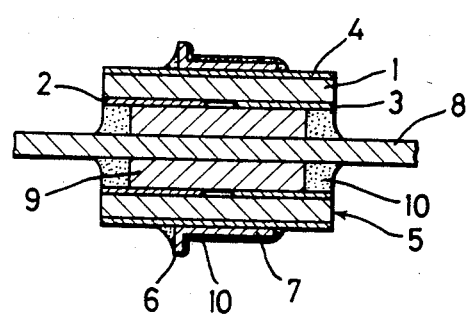

The conventional LC filter, such as a noise filter, for example as shown in FIG. 6, is provided with a cylindrical capacitor 5 comprising a cylindrical dielectric member 1, electrodes 2 and 3 (hereinafter referred to as the internal electrodes) disposed on the inside of the dielectric 1 and separate from each other, and an electrode 4 (hereinafter referred to as the external electrode) disposed on the outside of the dielectric 1 and opposite in common to the internal electrodes 2 and 3. A cylindrical eyelet member 7 having a flange 6 serving as the ground terminal is fitted on the outer periphery of the cylindrical capacitor 5, a ferrite bead 9 of a cylindrical magnetic substance through which a central conductor 8 passes is inserted into the cylindrical capacitor 5, and thereafter the cylindrical capacitor 5 as a whole is dipped into a molten solder tank, so that the internal electrodes 2 and 3 and contral conductor 8, and the external electrode 4 and eyelet member 7, are soldered to each other by solder 10.

Figure 7:
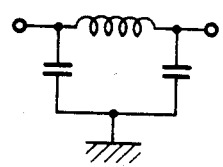
Figure 8:
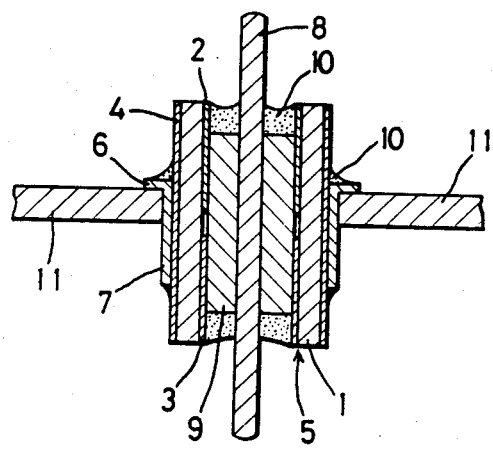

The conventional noise filter manufactured by such method forms an equivalent circuit as shown in FIG. 7 and is fixed to a mounting portion 11, for example, a metal chassis, by the flange 6 with the eyelet member 7 sevrving as the ground terminal as shown in FIG. 8.

Thus, the conventional noise filter constructed as above-mentioned is dipped completely into the molten solder tank for the soldering connection, whereby a lot of solder 10 enters into openings in the cylindrical capacitor 5. Hence, when the noise filter is mounted on the mounting portion 11, the heat applied to the filter remelts the solder 10, whereby there is a fear that the solder 10 will flow to the exterior and short-circuit the internal electrodes 2 and 3 and external electrode 4. Also, there is a fear that a lot of solder 10 entering into the openings causes thermal contraction to result so that a crack is created in the cylindrical dielectric 1. Accordingly, the conventional noise filter can have problems with reliability.

An object of the invention is to provide a manufacturing method for an LC filter, which avoids the danger that, when a cylindrical capacitor is soldered onto a chassis or the like, the internal electrodes and external electrode of the cylindrical capacitor will short-circuit with each other.

Another object of the invention is to provide a manufacturing method for an LC filter, in which there is no danger of producing a crack in a cylindrical dielectric and which has high reliability.

The above and other objects and features of the invention will appear more fully hereinafter from a consideration of the following description taken in connection with the accompanying drawing wherein one example is illustrated by way of example.

Figure 1:
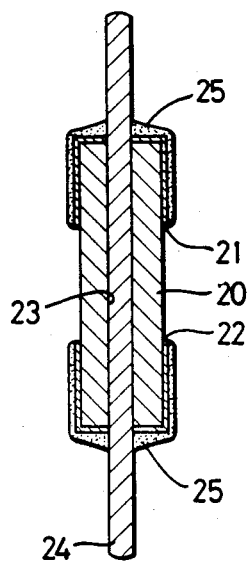
Figure 2:
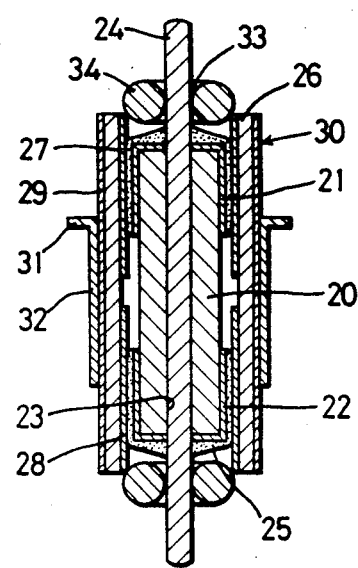
Figure 3:
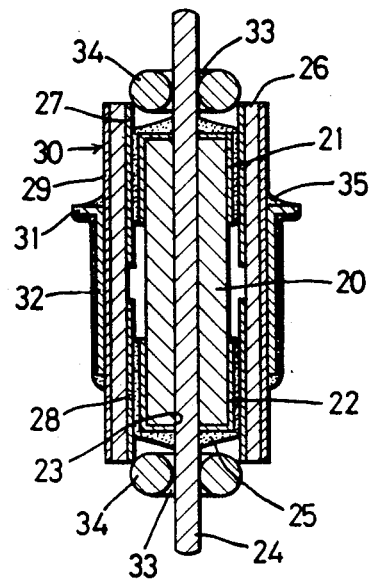
Figure 4:
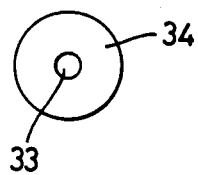
Figure 5:
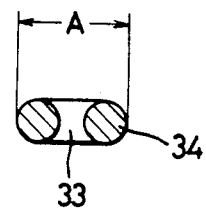

FIG. 1 is a longitudinal sectional view of a ferrite bead and a central conductor in combination, FIG. 2 is longitudinal sectional view of the ferrite bead in FIG. 1 and cylindrical capacitor in combination, FIG. 3 is a longitudinal sectional view of a finished noise filter, FIG. 4 is a plan view of a sealing member, FIG. 5 is a longitudinal sectional view thereof, FIG. 6 is an illustration of a conventional noise filter, FIG. 7 shows an equivalent circuit for the same, and FIG. 8 is a longitudinal sectional view exemplary of the conventional noise filter when in use.

Referring to FIGS. 1 through 3, the manufacturing processes for a noise filter according to the invention are shown in order.

Firstly, as shown in FIG. 1, a ferrite bead 20 of a cylindrical magnetic substance is prepared and two electrodes 21 and 22 separate from each other are placed on the ferrite bead 20 and extending from both end faces onto the outer peripheral surface thereof. Next, a central conductor 24 is inserted into a through hole 23 in the ferrite bead 20 and thereafter these members are dipped into molten solder to thereby preliminarily apply solder 25 to the electrodes 21 and 22 and central conductor 24 (hereinafter referred to as the presoldering step).

Also, as shown in FIG. 2, a cylindrical dielectric member 26 is prepared, and on the inner surface thereof are provided two electrodes 27 and 28 (hereinafter referred to as the internal electrodes 27 and 28) separate from each other and on the outer surface of the dielectric 26 is provided an electrode 29 (hereinafter referred to as the external electrode 29) opposite in common to the internal electrodes 27 and 28, thereby forming a cylindrical capacitor 30. Onto the external electrode 29 there is fitted a cylindrical eyelet member 32 having a flange 31 forming a ground terminal.

The ferrite bead 20 through which the central conductor 24 passes is inserted into the cylindrical capacitor 30 on which the eyelet member 32 is fitted. Next, a sealing member which, as shown in FIGS. 4 and 5, has an outer diameter A about equal to or larger than the inner diameter of the cylindrical capacitor 30 and a through hole 33 with a diameter about equal to or slightly smaller than that of the central conductor 24 and which is formed of an elastic material, such as silicon rubber, is mounted in a sealing manner over the openings at both ends of the cylindrical capacitor 30 with the central conductor 24 inserted through the through hole 33, thereby sealing the cylindrical capacitor 30.

Thereafter, the cylindrical capacitor 30, as shown in FIG. 3, is dipped completely in molten solder and the eyelet member 32 and external electrode 29 are connected by solder 35, at which time the heat applied from the exterior of the cylindrical capacitor 30 results the presolder 25 therein remelting, so that the electrodes 21 and 22 on the ferrite bead 20 and the internal electrodes 27 and 28 on the cylindrical capacitor 30 are simultaneously soldered to each other. In addition, before the sealing members 34 are mounted, creamy solder, if needed, is fed in a necessary amount into the cylindrical capacitor 30, thereby further ensuring the soldering connection between the above members.

As seen from the above, the solder 25 or connecting the electrodes 21 and 22 on the ferrite bead 20 and the internal electrodes 27 and 28 on the cylindrical capacitor 30, is applied to the electrodes 21 and 22 on the ferrite bead 20 and central conductor 24 when the ferrite bead 20 and central conductor 24 are dipped in molten solder. Moreover, even if the eyelet member 32 and the external electrode 29 on the cylindrical capacitor 30 are dipped into molten solder to be soldered by solder 35, the existing sealing members 34 prevent the molten solder from entering into the cylidrical capacitor 30, whereby there is only a small amount of solder 25 within the cylindrical capacitor 30. As a result, there is no danger that when the filter is mounted on the chassis or the like, the heat applied to the filter results in the solder 25 within the cylindrical capacitor 30 remelting and flowing out and causing a short-circuit of the internal electrodes 27 and 28 on the cylindrical capacitor 30 with the external electrode 29 thereof, and also that a crack may be produced in the cylindrical dielectric 26. Hence, the LC filter of the invention has high reliability.

Also, an embodiment of the LC filter of the invention has an equivalent circuit shown in FIG. 7.

In addition, the manufacturing method for the LC filter of the invention is not confined to the above embodiment, but is of course properly variable within the scope of the principle.

For example, instead of the ferrite bead 20 through which the central conductor 24 passes being dipped into molten solder to thereby have the presoldering solder 25 applied, creamy solder may be applied to both the openings of the cylindrical capacitor 30 after the ferrite bead 20 and central conductor 24 are inserted therein. In this case, the creamy solder may be applied by use of a proper method such as both the openings of the cylindrical capacitor 30 being dipped into the creamy solder, or the creamy solder being injected into both the openings by the use of a dispenser or the like.

The eyelet member 32 may alternatively be fitted on the external electrode 29 of the cylindrical capacitor 30 after the ferrite bead 20 through which the central conductor 24 passes is inserted within the cylindrical capacitor 30.

Alternatively, the ferrite bead 20 through which the central conductor 24 passes may have the presoldering solder 25 applied by use of solder having a high melting point and then be inserted into the cylindrical capacitor 30. Thereafter, the presoldering solder 25 may be heated from the exterior of the cylindrical capacitor 30 and remelted to thereby at first solder the electrodes 21 and 22 on the ferrite bead 20 to the internal electrodes 27 and 28 on the cylindrical capacitor 30 respectively, and then the cylindrical capacitor 30 on which the sealing members 34 are mounted may be dipped in molten solder having a lower melting point than the presoldering 25, solder thereby soldering the external electrode 29 to the eyelet member 32.

Also, the sealing members 34 need not be elastic material, such as silicon rubber, but may be made of a material of any quality or shape which achieves the same effect.

The electrode formed on the inner surface of the cylindrical dielectric member 26 is not limited to one divided in two, but may be one continuous electrode. In this case, the electrode to be formed on the ferrite bead 20 is not required to be disposed on both end faces, but need only be on one end face.

The electrode to be formed on the ferrite bead 20 need not extend from the end face onto the outer periphery of the ferrite 20, but may be formed only on the end face.

The eyelet member 32 is not always required to have the flange 31, but may have no flange.

Also, the eyelet member 32 is not indispensable, so that when it is not used, the external electrode 29 on the cylindrical capacitor 30 may if needed have solder applied by dipping the cylindrical capacitor 30 on which the sealing members 34 are mounted into molten solder. When no eyelet member 32 is used and no solder is applied to the external electrode on the cylindrical capacitor 30, the presoldering solder 25 is remelted by heat applied from the exterior of the cylindrical capacitor 30 by putting the capacitor 30 into a heating furnace or the like.

In addition, the LC filter of the invention is not limited to a noise filter, but may be any other kind of similar filter.

What is claimed is:

1. A manufacturing method for an LC filter having a cylindrical magnetic material member, a central conductor passing therethrough, and a cylindrical capacitor into which said magnetic material member is inserted, said manufacturing method comprising the steps of:
    forming electrodes on the inside and the outside of a cylindrical dielectric member for forming said cylindrical capacitor;
    forming electrodes on at least the two end faces of said cylindrical magnetic material member;
    passing said central conductor through said magnetic material member on which said electrodes are formed;
    applying solder to said central conductor and said electrodes on said magnetic material member;
    inserting said magnetic material member with said soldered electrodes and said central conductor into said cylindrical capacitor;
    placing on said central conductor at each end of said magnetic material member a sealing member having a through hole of a diameter which is from about equal to that of said central conductor to slightly smaller than that of said central conductor, and having an outer diameter which is from about equal to the inner diameter of said cylindrical capacitor to larger than the inner diameter of said cylindrical capacitor by inserting said central conductor through said through holes in said sealing members, and then moving said sealing members into sealing engagement with the respective ends of said cylindrical capacitor;
    dipping said cylindrical capacitor on which said sealing members are mounted into molten solder for applying solder to said external electrode on said cylindrical capacitor, and remelting the solder applied to said electrodes on said magnetic material member and said central conductor by applying heat from the exterior of said cylindrical capacitor, thereby soldering said electrodes on said magnetic material member to said internal electrodes of said cylindrical capacitor.

2. A manufacturing method as claimed in claim 1, wherein during the step of soldering said electrodes on said magnetic material member and said internal electrodes on said cylindrical capacitor, the heat for remelting said solder applied to said electrodes on said magnetic material member and said central conductor is applied when said cylindrical capacitor is dipped in molten solder to apply solder to said external electrode on said cylindrical capacitor.

3. A manufacturing method as claimed in claim 1, wherein said heat applying step for soldering said electrodes on said magnetic material member and said internal electrodes on said cylindrical capacitor is first carried out, and thereafter said cylindrical capacitor on which said sealing members are mounted is dipped in molten solder to thereby apply solder to said external electrode on said cylindrical capacitor.

4. A manufacturing method for an LC filter having a cylindrical magnetic material member, a central conductor passing therethrough, and a cylindrical capacitor into which said magnetic material member is inserted, said manufacturing method comprising the steps of:

forming electrodes on the inside and the outside of a cylindrical dielectric member for forming said cylindrical capacitor;

forming electrodes on at least the two end faces of said cylindrical magnetic material member;

passing said central conductor through said magnetic material member on which said electrodes are formed;

applying solder to said central conductor and said electrodes on said magnetic material member;

inserting said magnetic material member with said soldered electrodes and said central conductor into said cylindrical capacitor;

fitting a cylindrical eyelet onto the outer peripheral surface of said cylindrical capacitor;

placing on said central conductor at each end of said magnetic material member a sealing member having a through hole of a diameter which is from about equal to that of said central conductor to slightly smaller than that of said central conductor, and having an outer diameter which is from about equal to the inner diameter of said cylindrical capacitor to larger than the inner diameter of said cylindrical capacitor by inserting said central conductor through said through holes in said sealing members, and then moving said sealing members into sealing engagement with the respective ends of said cylindrical capacitor;

dipping said cyindrical capacitor on which said sealing members are mounted into molten solder for soldering said eyelet to said external electrode on said cylindrical capacitor, and remelting the solder applied to said electrodes on said magnetic material member and said central conductor by applying heat from the exterior of said cylindrical capacitor, thereby soldering said electrodes on said magnetic material member to said internal electrodes of said cylindrical capacitor.

5. A manufacturing method as claimed in claim 4, wherein during the step of soldering said electrodes on said magnetic material member and said internal electrodes on said cylindrical capacitor, the heat for remelting said solder applied to said electrodes on said magnetic material member and said central conductor is applied when said cylindrical capacitor is dipped in molten solder to solder said eyelet to said external electrode on said cylindrical capacitor.

6. A manufacturing method as claimed in claim 4, wherein said heat applying step for soldering said electrodes on said magnetic material member and said internal electrodes on said cylindrical capacitor is first carried out, and thereafter said cylindrical capacitor on which said sealing mmebers are mounted is dipped in molten solder to thereby solder said eyelet to said external electrode on said cylindrical capacitor.

7. A manufacturing method for an LC filter having a cylindrical magnetic material member, a central conductor passing therethrough, and a cylindrical capacitor into which said magnetic material member is inserted, said manufacturing method comprising the steps of:

forming electrodes on the inside and the outside of a cylindrical dielectric member for forming said cylindrical capacitor;

forming electrodes on at least the two end faces of said cylindrical magnetic material member;

passing said central conductor through said magnetic material member on which said electrodes are formed;

applying solder to said central conductor and said electrodes on said magnetic material member;

inserting said magnetic material member with said soldered electrodes and said central conductor into said cylindrical capacitor;

placing on said central conductor at each end of said magnetic material member a sealing member having a through hole of a diameter which is from about equal to that of said central conductor to slightly smaller than that of said central conductor, and having an outer diameter which is from about equal to the inner diameter of said cylindrical capacitor to larger than the inner diameter of said cylindrical capacitor by inserting said central conductor through said through holes in said sealing members, and then moving said sealing members into sealing engagement with the respective ends of said cylindrical capacitor; and remelting the solder applied to said electrodes on said magnetic material member and said central conductor by applying heat from the exterior of said cylindrical capacitor, thereby soldering said electrodes on said magnetic material member to said internal electrodes of said cylindrical capacitor.

* * * * *